(12) United States Patent
Chen et al.

(10) Patent No.: US 8,423,846 B2
(45) Date of Patent: Apr. 16, 2013

(54) INTEGRATED CIRCUIT WITH MEMORY BUILT-IN SELF TEST (MBIST) CIRCUITRY HAVING ENHANCED FEATURES AND METHODS

(75) Inventors: Wei-Yu Chen, Fremont, CA (US); Kevin Badgett, Campbell, CA (US); Kay Hessee, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 285 days.

(21) Appl. No.: 12/883,441

(22) Filed: Sep. 16, 2010

(65) Prior Publication Data

US 2012/0072788 A1    Mar. 22, 2012

(51) Int. Cl.
    *G01R 31/28*    (2006.01)
(52) U.S. Cl.
    USPC .................. 714/733; 714/742; 714/718
(58) Field of Classification Search .......... 714/718, 714/733, 742
    See application file for complete search history.

(56) References Cited

U.S. PATENT DOCUMENTS

| | | | |
|---|---|---|---|
| 6,381,715 B1 * | 4/2002 | Bauman et al. | 714/718 |
| 6,530,052 B1 * | 3/2003 | Khou et al. | 714/733 |
| 6,760,865 B2 * | 7/2004 | Ledford et al. | 714/30 |
| 6,959,256 B2 * | 10/2005 | Basto | 702/117 |
| 7,139,946 B2 * | 11/2006 | Nadeau-Dostie et al. | 714/720 |
| 7,225,375 B2 * | 5/2007 | Cochran et al. | 714/733 |
| 7,340,658 B2 | 3/2008 | Seuring | |
| 7,434,131 B2 * | 10/2008 | Mukherjee et al. | 714/733 |
| 8,156,391 B2 * | 4/2012 | Andreev et al. | 714/718 |
| 8,208,326 B1 * | 6/2012 | Solt et al. | 365/201 |

OTHER PUBLICATIONS

Molyneaux et al., "Design for Testability Features of the SUN Microsystems Niagara2 CMP/CMT SPARC chip," IEEE International Test Conference, pp. 1-8 (Oct. 2007).

* cited by examiner

*Primary Examiner* — Esaw Abraham
(74) *Attorney, Agent, or Firm* — Volpe and Koenig, P.C.

(57) ABSTRACT

Integrated circuits with memory built-in self test (MBIST) circuitry and methods are disclosed that employ enhanced features. In one aspect of the invention, an integrated circuit is provided having MIBST circuitry configured to serially test multiple arrays of memory elements within a component of the integrated circuit and to also conduct parallel initialization of the serially tested arrays. In another aspect of the invention, the MBST circuitry is used set the memory elements of the arrays to a first state and then to an inverse state during a burn-in operation to maintain each of the two opposing states for a desired time in order to either force a failure of the integrated circuit component or produce a pre-stressed component beyond an infancy stage.

24 Claims, 3 Drawing Sheets

INTEGRATED CIRCUIT WITH MEMORY BUILT-IN SELF TEST (MBIST) CIRCUITRY HAVING ENHANCED FEATURES AND METHODS

FIELD OF INVENTION

The present invention is generally directed to integrated circuits and in particular, to integrated circuits having memory built-in self test (MBIST) circuitry and related methods.

BACKGROUND

Integrated circuits having memory arrays that are designed and manufactured with memory built-in self test (MBIST) circuitry are well-known in the art. An example of an integrated circuit incorporating MBIST circuitry is set forth in U.S. Pat. No. 7,340,658 that is assigned to the assignee of the present invention. That patent also provides background information regarding the utility and advantages provided by MBST circuitry in the design and manufacturer of integrated circuits.

Integrated circuit employing MBIST generally include multiple different size arrays of memory elements that require testing. Typically, during MBST testing, a test vector is written into an array and then a read operation is performed with the results analyzed to confirm proper operation of the array under the test vector. Within a given component or section of an integrated circuit, each array of that component is conventionally tested in series in order to analyze any result of the application of the respective test vector with the respective array.

SUMMARY

Integrated circuits with memory built-in self test (MBIST) circuitry and methods are disclosed that employ enhanced features.

In one aspect of the invention, an integrated circuit is provided having MIBST circuitry configured to serially test multiple arrays of memory elements within a component of the integrated circuit and to also conduct parallel initialization of the serially tested arrays. The parallel initialization serves, inter alia, to reduce the time required to set the memory elements within the arrays to a desired state. Accordingly, this feature assists the integrated circuit to expeditiously exit a power off state with respect to the components in which it is implemented.

In a preferred embodiment, the MBIST circuitry includes an MBIST master circuit configured to control multiple MBIST slave circuits where the MBIST slave circuits are each associated with a set of arrays within a respective integrated circuit component. In such embodiment, it is preferred that the master MBST circuitry is configured to issue a global built-in self initialization (BISI) instruction directing the multiple MBIST slave circuits to input initialization vectors in parallel into their respective associated arrays in order to quickly set the memory components of the arrays into a desired state for integrated circuit operation. Preferably, the MBIST master circuit is similarly configured to provide global instructions to the MBIST slave circuitry to input in parallel desired stress vectors and inverse stress vectors to result in a pre-stressed integrated circuit.

In another aspect of the invention, the MBST circuitry is configured to input stress and inverse stress vectors into the arrays of the integrated circuit component to set the memory elements of the arrays to a first state and then to an inverse state. Preferably, the stress and inverse stress vectors are applied during a burn-in operation to maintain each of the two opposing states for a desired time during burn-in in order to either force a failure of the integrated circuit component or produce a pre-stressed component beyond a desired infancy stage of the integrated circuit. Preferably, the time allocated for the memory elements to be maintained in the first state during a burn-in operation is roughly equal to the time the memory elements are to be maintained in the inverse state during the burn-in operation. To the extent that the application of the stress and inverse stress vectors by the MBIST circuitry during a burn-in does not cause a failure of the integrated circuit component, a pre-stressed component having greater reliability is produced.

The stress and inverse stress vectors may be applied alternately or in series. Preferably, each vector is applied the same number of times to maintain the respective memory states for substantially the same amount of time. In a preferred embodiment, the either the stress or inverse stress vectors that are used are the same as the initialization vectors used for setting the memory elements of the arrays to a desired state for integrated circuit operation. In a preferred embodiment, the stress vectors are applied in parallel to the arrays of the component of the integrated circuits. Thereafter the inverse stress vectors are applied in parallel to the arrays.

Other objects and advantages of the present invention will become apparent from the drawings and following detailed description of presently preferred embodiments.

BRIEF DESCRIPTION OF THE DRAWING(S)

DETAILED DESCRIPTION

Figure 1:
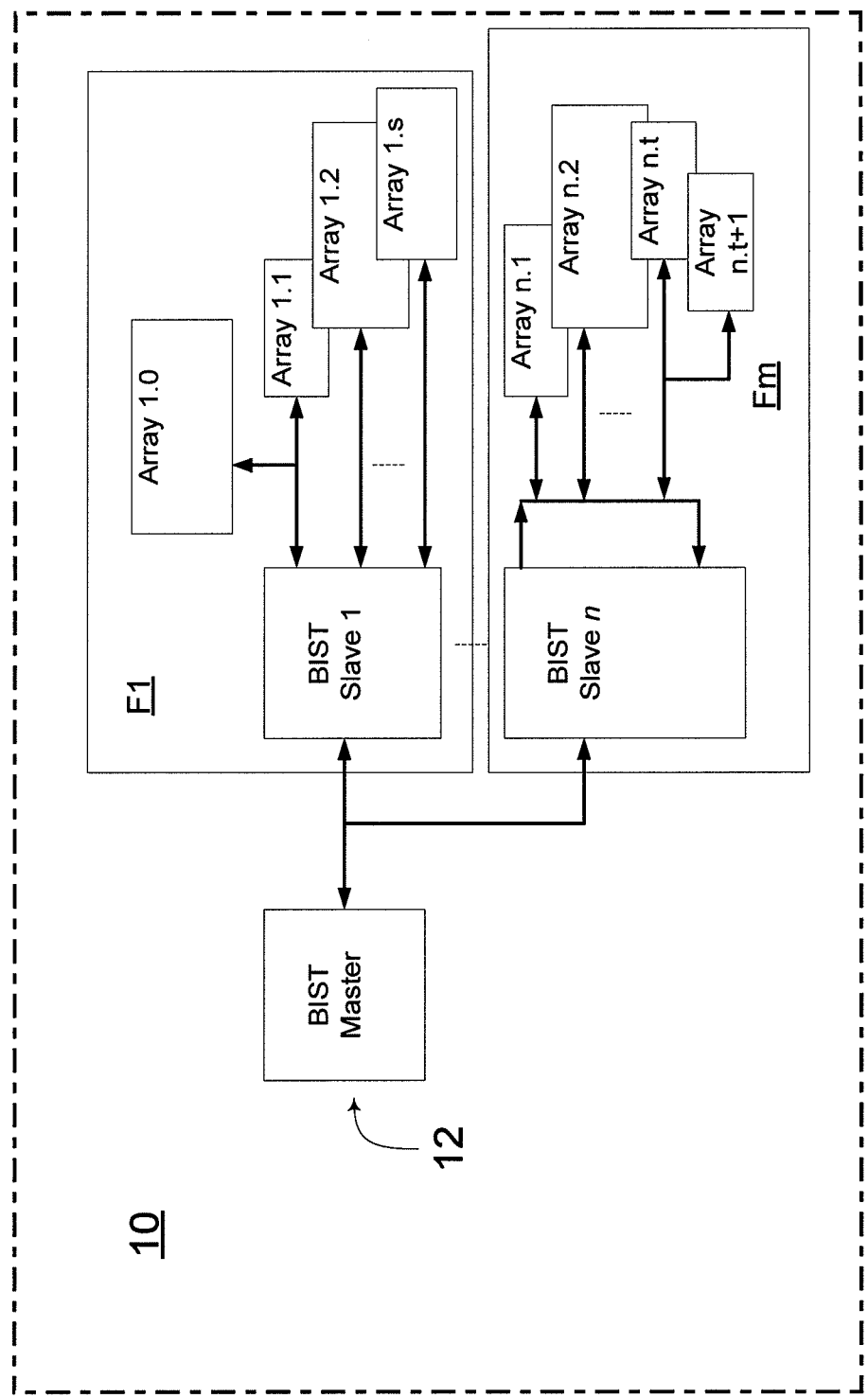
FIG. 1 is a schematic block diagram of memory built-in self test (MBIST) circuitry configured in accordance with the present invention.

Referring to FIG. 1, a preferred embodiment of an intergrated circuit (IC) 10 is shown having various functional components F1, . . . , Fm that each include arrays of memory elements; Array 1.0 through Array 1.s of functional unit F1 and Array n.1 through Array n.t. It will be understood that IC 10 may have other functional components that do not include memory arrays or may have a single functional component that includes memory arrays. Generally the IC will include memory arrays of various sizes.

The IC includes memory built-in self test (MBIST) circuitry 12 associated with multiple arrays of at least one functional unit. In the preferred embodiment illustrated in FIG. 1, the MBIST circuitry 12 includes MBIST master circuitry, BIST Master, that controls a plurality of MBIST slave circuits, BIST Slave 1-BIST Slave n, through a ring type bus interface.

Each MBIST slave circuit is preferably associated with multiple arrays of one of the functional units. A MBIST slave circuit is preferably associated with each functional unit that has memory arrays, but some functional units may be associated with multiple MBIST slave circuits that each are associated with different sets of arrays within the functional unit.

For a microprocessor application, the MBIST slave circuits typically are each associated with from five to twenty arrays having memory elements that range in size of 64×32 bits to 256×512 bits. The number of arrays and array size is may be outside such typical ranges. Where a functional unit has more than twenty arrays, the arrays are preferably divided in sets that are each associated a different MBIST slave circuit.

Preferably, either a star type interface or a ring type interface is used between each MBIST slave circuit and its associated arrays. FIG. 1 illustrates MBIST slave circuit BIST Slave 1 associated in a star type configuration arrays Array 1.0 through Array 1.s of functional unit F1 and MBIST slave circuit BIST Slave n associated in a ring type configuration with Array n.1 through Array n.t of functional unit Fm. In some cases, the interface between a MBIST slave circuit its associated arrays may include logic connections shared by more than one array. For example, FIG. 1 illustrates shared logic in the interface between MBIST slave circuit BIST Slave 1 and arrays Array 1.0 and Array 1.1 and shared logic in the interface between MBIST slave circuit BIST Slave n and arrays Array n.t and Array n.t+1.

The MBIST circuitry 12 is configured to conduct serial testing of the arrays within each functional unit that it is associated. In the preferred embodiment shown in FIG. 1, each MBIST slave circuit is configured to conduct MBIST testing of the arrays with which it is associated.

The MBIST circuitry is also configured conduct parallel initialization of multiple arrays within at least one of the functional units for which the MBIST circuitry is configured to conduct serial testing. Parallel initialization is preferably performed by providing initialization data to the arrays in parallel to set each the memory elements of the plurality of arrays to an initialization state.

For example, the MBIST circuitry is preferably configured to conduct the parallel initialization by inputting a respective initialization vector to each array. The initialization vector for an array may be the same or different that a test vector used to test the array. A vector of either all 1s or all 0s may be used as the initialization vector for respective arrays to set the memory elements to an initialization state of all 0s or all 1s as may be desired for particular arrays. Preferably, the MBIST circuitry uses a vector of all 1s as the initialization vector for at least one array and/or uses a vector of all 0s as the initialization vector for at least one other array.

Generally, initialization is required when the IC is powered to an on state. IC initialization may include a first initialization of the IC logic components, followed by MBIST initialization to initialize the memory arrays, followed by a second initialization of the logic circuits to assure that any logic setting changed during the MBIST initialization are restored to their desired initialized state. Preferably, the memory arrays are maintained in a read-only state when the second logic initialization is conducted.

Instead of initializing arrays in the serial manner in which they are tested, the MBIST circuitry employs parallel initialization to greatly reduce the time needed for MBIST initialization of the memory arrays. Although the present addition of the parallel initialization functionality of the MBIST circuitry with respect to arrays that are tested serially adds complexity to the MBIST circuitry, this is offset by the increase in initialization speed achieved.

During operation of the IC it is often desired to reduce power consumption and the generation of heat by switching the IC or various components thereof to a power off state. An example of a power off state for microprocessors is the C6 state. Where the IC is configured to selectively implement a power off state with respect to the functional units with which the MBIST circuitry is associated, the MBIST circuitry is preferably configured to conduct the parallel initialization in connection with exiting the power off state. The resultant relatively fast exit provides improved IC performance.

Preferably the MBIST circuitry 12 is configured to conduct parallel initialization of a plurality of arrays within all of the functional units with which the MBIST circuitry is associated. In the preferred embodiment shown in FIG. 1, MBIST slave circuit BIST Slave 1 is configured to conduct parallel initialization of arrays Array 1.1 through Array 1.s and MBIST slave circuit BIST Slave n is configured to conduct parallel initialization of arrays Array n.1 and Array n.t.

Preferably, all of the arrays associated with a MBIST slave circuit can be initialized in parallel, but this may not be possible due to the interface between a MBIST slave circuit and two or more arrays. For example, due to its shared logic interface with Array 1.1, Array 1.0 is not included in the plurality of arrays with which MBIST slave circuit BIST Slave 1 is configured to conduct parallel initialization. Similarly, due to its shared logic interface with Array n.t, Array n.t+1 is not included in the plurality of arrays with which MBIST slave circuit BIST Slave n is configured to conduct parallel initialization. In this case, MBIST slave circuit BIST Slave 1 is preferably configured to conduct initialization of Array 1.0 serially after initialization of Array 1.1 and MBIST slave circuit BIST Slave n is preferably configured to conduct initialization of Array n.t+1 serially after initialization of Array n.t.

The MBIST master circuitry is preferably configured to send a global initialization command to the MBIST slave circuits to commence the parallel initialization of the plurality of arrays with which the MBIST slave circuits are configured to conduct parallel initialization. The largest array size generally represents a lower limit on the time to initialize all the arrays, since initialization of an array generally requires one cycle per bit of memory.

Where some arrays are not included in the arrays that are initialized in parallel, such as Array 1.0 and Array n.t+1 of FIG. 1, additional initialization time may or may not be required. For example, if Array n.2 is 256×512 bits and is the largest array and that is included in the parallel initialization, additional initialization time will not be required to initialize Array n.t+1 serially after initialization of Array n.t, if both combined are smaller that Array n.2, such as if both are 64×32 bits. However, is such case if Array 1,0 which is not included in the parallel initialization is 256×512 bits, additional initialization time will be required to initialize Array 1.0 serially after initialization of Array 1.1, since they will combine to be greater than the size of Array n.2. Accordingly, it is preferred to incorporate the largest arrays within the arrays that are included in the parallel initialization so that MBIST initialization equals the initialization time of the largest array.

Figure 2:
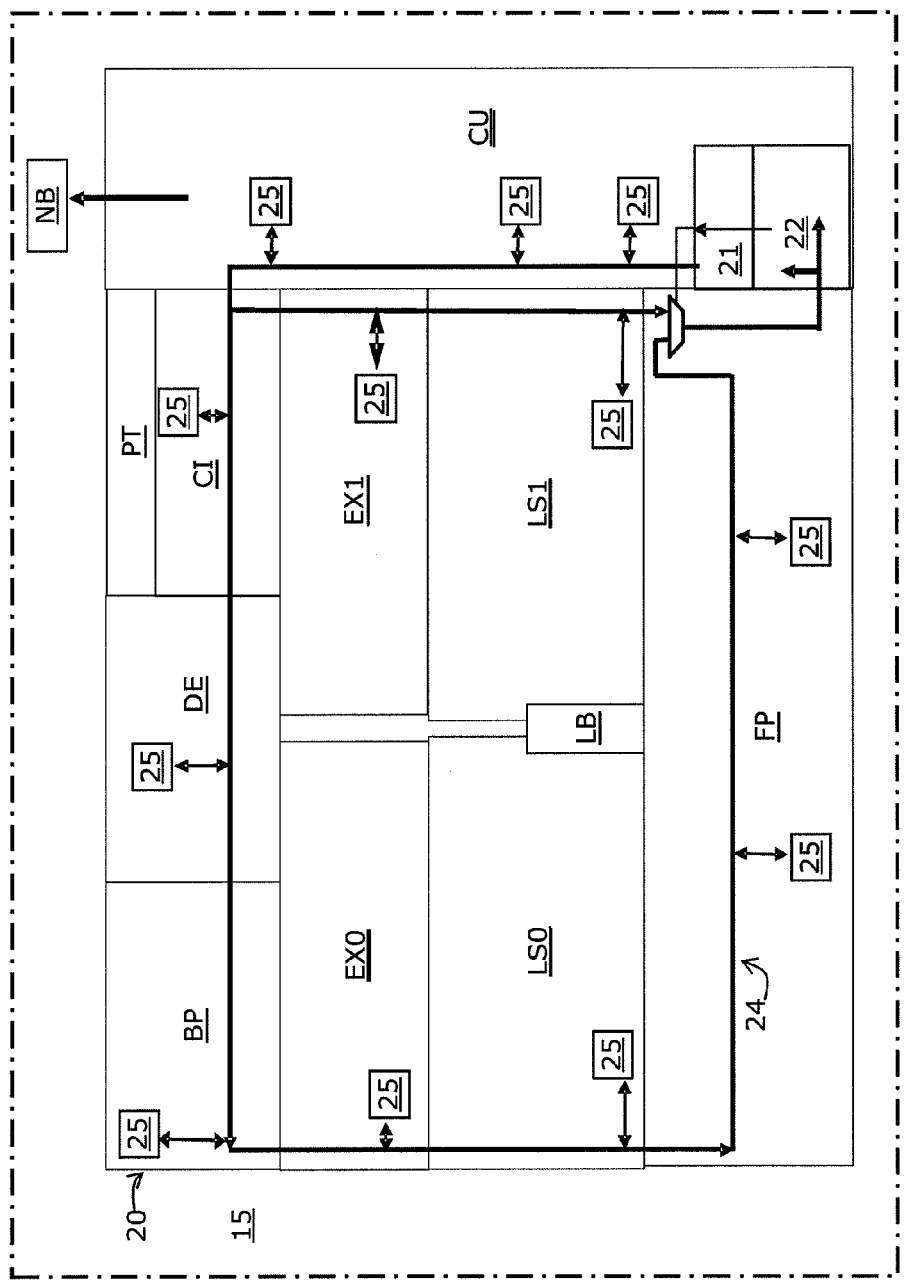
FIG. 2 is a schematic diagram of an IC having a processor core with MBIST master and slave circuitry in accordance with an embodiment of the present invention.

Referring to FIG. 2, a second embodiment is illustrated of a multi-core microprocessor IC 15 that includes processor core 20 that interfaces with a North Bridge, NB, of IC 15. The processor core 20 has multiple functional components that have multiple memory arrays including a unified L2 Cache, CU, an Instruction Cache, CI, a Decoder unit, DE, a Branch Predication unit, BP, a Floating Point unit, FP and two clusters of Execution and Load/Store Units, EX0, LS0 and EX1, LS1, for dual thread processing. The processor core 20 also has functional components that do not have memory arrays including a Power/Thermal unit, PT, and a Load Buffer, PB, associated with the thread processing clusters. In this embodiment, even though the load buffer does include memory, such memory is preferably implemented in logic and flops not in memory arrays.

The processor core 20 includes Debug Circuitry 22 that is in communication with the various functional components via bus 24. MBIST processing circuitry is provided that includes MBIST master circuitry 21 and MBIST slave circuits 25. The MBIST master circuitry 21 is configured to utilize the debug bus 24 to communicate with the MBIST slave circuits 25.

One MBIST slave circuit 25 is associated with the memory arrays in each of the Instruction Cache, CI, Decoder, DE, Branch Predication, BP, Floating Point, FP, Execution, EX0, EX1, and Load/Store LS0, LS1, functional units of IC 15. Two MBIST slave circuits 25 are associated with different sets of the memory arrays in the Floating Point unit, FP. Three MBIST slave circuits 25 are associated with different sets of the memory arrays in unified L2 Cache, CU. Each MBIST slave circuit 25 is associated with a plurality of the arrays within each respective functional unit for both serial testing and parallel initialization of the plurality of arrays. In some cases, a MBIST slave circuit 25 is associated with on or more additional arrays within its respective functional unit for serial testing, but not for parallel initialization. For example, Instruction Cache, CI, includes a number of arrays that share common logic in their slave circuit interface and accordingly only one of the arrays with the shared logic is included in the plurality of arrays that are initialized in parallel. The MBIST slave circuit 25 is configured to initialize arrays not included in the parallel initialization following the completion of respective arrays that are included in the parallel initialization.

In operation, the MBIST circuitry 21, 25 conducts parallel initialization of the plurality of arrays of the plurality of functional unit by providing initialization data to the plurality of arrays of the plurality of functional unit in parallel to set the memory elements to an initialization state. Preferably, the MBIST master circuitry 21 is used to send a global initialization command to the MBIST slave circuits 25 to commence the parallel initialization of the plurality of arrays of the plurality of functional unit. Preferably, the parallel initialization is conducted by inputting a respective initialization vector to each array.

The MBIST slave circuits 25 may use a vector of either all 1s or all 0s as the initialization vector for each array where the desired initialization state for the memory elements of a respective array is either all 1s or all 0s. However, the MBIST slave circuits 25 may be configured to input a different vector depending upon the initialization state desired for memory elements of any given array. In one embodiment, the MBIST circuitry uses a vector of all 1s as the initialization vector for at least one array and a vector of all 0s as the initialization vector for at least one other array.

Preferably, the IC 15 is configured to selectively implement a power off state of the processor core 20. In such case, the MBIST circuitry 21, 25 is preferably used to conduct the parallel initialization in connection with exiting the power off state.

Figure 3:
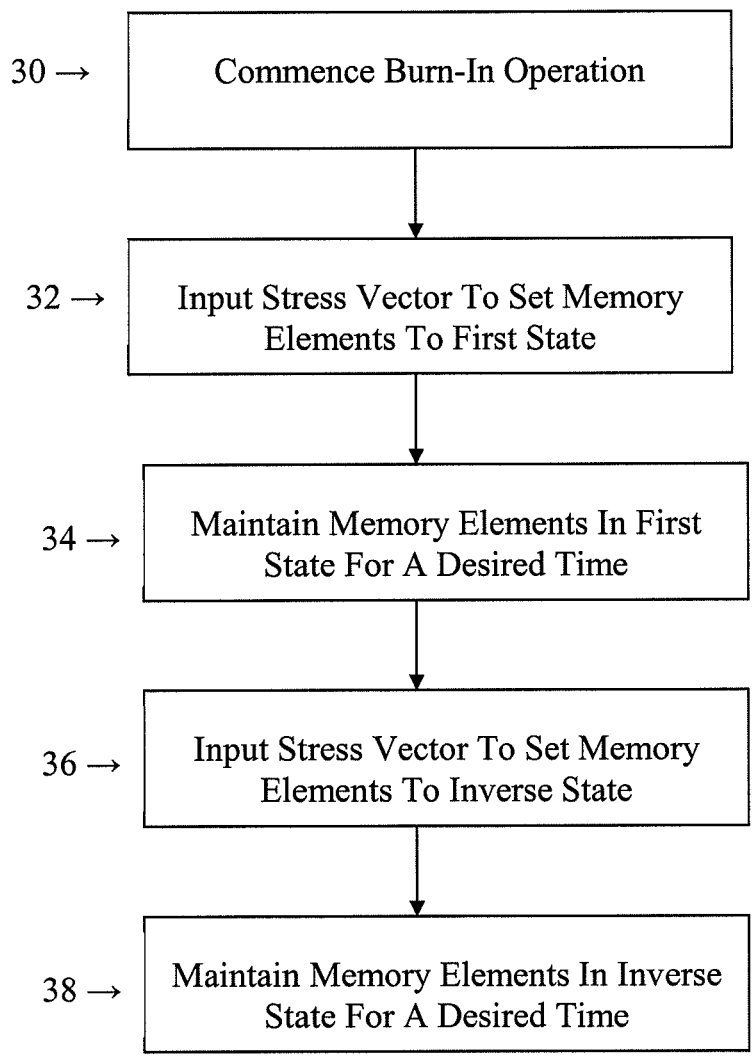
FIG. 3 is a block diagram of a method for stressing an integrated circuit in accordance with an embodiment of the present invention.

Referring to FIG. 3, a flow chart illustrating a further enhancement of the functionality of MBIST circuitry. In connection with this embodiment of the invention, the MBIST circuitry is configured to be able to set the memory elements of multiple arrays to a first state and to thereafter set each memory element of the arrays to a second state that is the inverse of the first state of the respective memory element. This added functionality to the MBIST circuitry that tests the multiple arrays, is particularly useful in pre-stressing the IC during completion of the manufacturing/testing processes to either force a failure of the integrated circuit component or produce a pre-stressed component beyond a desired infancy stage of the IC.

Preferably, an IC is provided with a functional unit that includes multiple arrays of memory elements and with memory built-in self test (MBIST) circuitry configured to test the multiple arrays of memory elements. A preferred method for stressing the IC then includes using the MBIST circuitry to stress the memory elements of the arrays by providing stress data to the arrays to set each memory element of the arrays in a first state and by providing inverse stress data to the arrays to set each memory element of the arrays in a second state that is the inverse of the first state of the respective memory element.

The stressing of the IC is preferably done during a burn-in operations. Typically, a burn-in operation is performed for thermal and voltage acceleration of an IC. Generally during a burn-in operation, a number of ICs includes are heated in an oven at a desired temperature and voltage setting for a desired length of time.

The size of the oven is determinative of how many ICs can be processed at one time. In a typical process, ICs are subject to heating at about 125° C. with a voltage setting of 1.3 to 1.4V for 12 hours. The ICs are then removed and run on a tester. Tests are generally conducted using the BIST circuitry of the IC. The tests usually include both Logic BIST (LBIST) tests that toggle general logic and MBIST tests that toggle arrays of memory. Various other functional tests may be conducted as well. The process is usually repeated one or more times in order to achieve a desired Failures In Time (FIT) rate. The FIT rate of a device is the number of failures that can be expected in one billion device-hours of operation.

Burn-in for commercial microprocessors may typically be for about a total of 48 hours, but can be a minimum of 240 hours for some military and space applications where a very low FIT rate is specified. Prior to burn-in the ICs typically test clean, but ICs that fail during the burn-in testing are repaired or discarded.

Through the stressing described above, more ICs are likely to fail during the burn-in process. However, be essentially forcing the failure of potentially defective ICs, an improved FIT rate results with respect to the ICs that pass testing through the burn-in process.

FIG. 3 illustrates a preferred method wherein the MBIST circuitry is used to stress the memory elements of the plurality of arrays during a burn-in operation of the IC. In step 30, the burn-in operation is commenced. In step 32, the MBIST circuitry is used to input a stress vector to the arrays to set each memory element of the arrays to a respective first state. In step 34, the first state of each memory element is maintained for a selected amount of time preferably at conventional heat and voltage settings. In step 36, the MBIST circuitry is used to input an inverse stress vector to the arrays to set each memory element of the arrays to a respective second state that is the inverse of the first state of the respective memory element. In step 38, the second state of each memory element is maintained for a selected amount of time preferably at conventional heat and voltage settings.

Preferably, the first state of each memory element is maintained for substantially the same amount of time as the second state of each memory element is maintained during the burn-in operation of the IC to provide balanced stressing of the arrays. Respective steps 32, 34 and 36, 38 may be selectively repeated such that the first state of each memory element is set multiple times during the burn-in operation of the IC and the second state of each memory element is set multiple times during the burn-in operation of the IC. It is preferred that the first state of each memory element is maintained for one-half hour to two hours during the burn-in operation of the IC and the second state of each memory element is also maintained for one-half hour to two hours during the burn-in operation of the IC.

The MBIST circuitry may be configured to use a vector of all 1s or all 0s as the stress vector for respective arrays to set the memory elements of the array to either all 0s or all 1s. In such case, the inverse stress vector will also be all 0s or all 1s, all 0s where the stress vector is all 1s and all 1s where the stress vector is all 0s. The MBIST circuitry may be configured to use a vector of all 1s as the stress vector for at least one array and to use a vector of all 0s as the stress vector for at least one other array. However, other vectors for the stress vector can be use as may be desired. For example, a vector of alternating 0s and 1s can be used as a stress vector with the inverse vector being a vector of alternating 1s and 0s. For reduced complexity of design, the MBIST circuitry preferably uses as either the stress vector or the inverse stress vector for each array a vector used to initialize the array for IC operation.

Preferably this aspect of the invention is implemented in conjunction with an IC having MBIST circuitry capable of parallel MBIST initialization of arrays that are serially tested as described above with respect to FIGS. 1 and 2. In such case, the MBIST circuitry preferably stresses the memory elements of the arrays by first inputting a stress vector in parallel to the arrays and then inputting an inverse stress vector in parallel to the arrays.

For implementation using the MBIST master circuitry and associated MBIST slave circuits of FIGS. 1 and 2, the MBIST master circuitry is preferably configured to issue a global instruction directing the MBIST slave circuits to conduct a parallel setting of array elements to their respective first states corresponding to the parallel initialization of arrays described above. The MBIST master circuitry is also preferably configured to issue a global inverse instruction directing the MBIST slave circuits to conduct a parallel setting of array elements to their respective second states corresponding to the parallel initialization of arrays described above.

For reduced complexity of design, the MBIST master circuitry preferably uses a global initialization instruction as either the global instruction or the global inverse instruction, the global initiation instructions such that the MBIST slave circuits use the vector for array initialization as either the stress vector or the inverse stress vector for each array. With respect to the embodiment of FIG. 2, MBIST master circuitry 21 is configured to issue the global initialization command to the MBIST slave circuits 25 to set the memory elements of the arrays to the first state during burn-in and is configured to issue an XBURN command to instruct the MBIST slave circuits 25 to set the memory elements of the arrays to the inverse state during burn-in. The global initialization command may simply contain an "XBURN" bit, such that when the "XBURN" bit is 0 in the command, the MBIST slave circuits 25 set the memory elements of the arrays to their initialization state and when the "XBURN" bit is 1 in the command, the MBIST slave circuits 25 set the memory elements of the arrays to the inverse of their initialization state.

As a result of maintaining memory elements in a first state for a selected amount of time during a burn-in operation and also maintaining those memory elements in a second state that is the inverse of the first state for a selected amount of time during the burn-in operation, ICs are produced having pre-stressed memory elements. Preferably, ICs are produced that include a functional unit having multiple arrays of memory elements that have been stressed. As applied to the example of IC 10 of FIG. 1, an IC is produced that includes a plurality of functional units that each has multiple arrays of memory elements wherein the memory elements of the arrays of each functional unit have been stressed. As applied to the example of IC 15 of FIG. 2, an IC is produced wherein the plurality of functional units includes a unified L2 Cache, an Instruction Cache, a Decoder unit, a Branch Predication unit, a Floating Point unit, an Execution unit and a Load/Store unit of one or more processor cores.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor.

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A method of initializing an integrated circuit (IC) comprising:
    providing the IC with a plurality of functional units configured to selectively implement a power off state, each including multiple arrays of memory elements and with memory built-in self test (MBIST) circuitry associated with a plurality of arrays within each respective functional unit for both serial testing and parallel initialization of the plurality of arrays; and
    using the MBIST circuitry to conduct parallel initialization of the plurality of arrays of the plurality of functional units in connection with exiting the power off state by providing initialization data to the plurality of arrays of the plurality of functional units in parallel to set the memory elements of the plurality of arrays of the plurality of functional units to an initialization state.

2. The method of claim 1 wherein:
    the IC is provided with MBIST circuitry that comprises MBIST master circuitry and a plurality of MBIST slave circuits that communicate with the MBIST master circuitry such that:
        each MBIST slave circuit is associated with a set of arrays of one of the functional units,
        at least one MBIST slave circuit is associated with each functional unit of the plurality of functional units, and
        each MBIST slave circuit is configured to conduct MBIST testing and initialization of the arrays with which it is associated; and
        the MBIST master circuitry is used to send a global initialization command to the MBIST slave circuits to commence the parallel initialization of the plurality of arrays of the plurality of functional units.

3. The method of claim 2 wherein an array of memory elements associated with one of the MBIST slave circuit is initialized serially with respect to another array of memory elements associated with that MBIST slave circuit.

4. The method of claim 2 wherein the plurality of functional units includes a unified L2 Cache, an Instruction Cache, a Decoder unit, a Branch Predication unit, a Floating Point unit, an Execution unit and a Load/Store unit and further comprising providing the IC with at least one functional unit that is not included in the plurality of functional units and that is not associated with any of the MBIST slave circuits.

5. The method of claim 2 wherein the functional units are units of a processor core that is configured to selectively implement the power off state.

6. The method of claim 1 wherein the parallel initialization is conducted by inputting a respective initialization vector to each array.

7. The method of claim 6 wherein the MBIST circuitry uses a vector of either all 1s or all 0s as the initialization vector for each array.

8. The method of claim 6 wherein the MBIST circuitry uses a vector of all 1s as the initialization vector for at least one array and uses a vector of all 0s as the initialization vector for at least one other array.

9. A method of initializing an integrated circuit (IC) comprising:
providing the IC with a functional unit including multiple arrays of memory elements and with memory built-in self test (MBIST) circuitry associated with a plurality of arrays within the functional unit for both serial testing and parallel initialization of the plurality of arrays, wherein the functional unit is configured to selectively implement a power off state and wherein the MBIST circuitry is used to conduct the parallel initialization in connection with exiting the power off state; and
using the MBIST circuitry to conduct parallel initialization of the plurality of arrays by providing initialization data to the plurality of arrays in parallel.

10. The method of claim 9 wherein the parallel initialization is conducted by inputting a respective initialization vector to each array.

11. The method of claim 10 wherein the MBIST circuitry uses a vector of either all 1s or all 0s as the initialization vector for each array such that the MBIST circuitry uses a vector of all 1s as the initialization vector for at least one array and uses a vector of all 0s as the initialization vector for at least one other array.

12. An integrated circuit (IC) comprising:
a plurality of functional units configured to selectively implement a power off state, each including multiple arrays of memory elements;
memory built-in self test (MBIST) circuitry associated with a plurality of arrays of each of the functional units;
the MBIST circuitry configured to conduct serial testing of the plurality of arrays of each functional unit; and
the MBIST circuitry configured to conduct parallel initialization of the plurality of arrays of the plurality of functional units in connection with exiting the power off state by providing initialization data to the plurality of arrays of the plurality of functional units in parallel.

13. The IC of claim 12 wherein the MBIST circuitry comprises MBIST master circuitry and a plurality of MBIST slave circuits that communicate with the MBIST master circuitry;
each MBIST slave circuit associated with a set of arrays of one of the functional units such that at least one MBIST slave circuit is associated with each functional unit of the plurality of functional units;
each MBIST slave circuit configured to conduct MBIST testing and initialization of the arrays with which it is associated; and
the MBIST master circuitry configured to send a global initialization command to the MBIST slave circuits to commence the parallel initialization of the plurality of arrays of the plurality of functional units.

14. The IC of claim 13 wherein each MBIST slave circuits is arranged in either a star configuration or a ring configuration with respect to its associated set of arrays.

15. The IC of claim 13 wherein at least one MBIST slave circuit is associated with an array of memory elements that is configured for initiaization serially with respect to another array of memory elements associated with that MBIST slave circuit.

16. The IC of claim 13 wherein the plurality of functional units includes a unified L2 Cache, an Instruction Cache, a Decoder unit, a Branch Predication unit, a Floating Point unit, an Execution unit and a Load/Store unit and further comprises at least one functional unit that is not associated with any of the MBIST slave circuits.

17. The IC of claim 16 wherein the unified L2 Cache and the Floating Point unit each is associated with more than one MBIST slave circuit and the IC includes a Power/Thermal unit as a functional unit that is not associated with any of the MBIST slave circuits.

18. The IC of claim 13 wherein the functional units are units of a core processor that is configured to selectively implement the power off state.

19. The IC of claim 12 wherein the MBIST circuitry is configured to conduct the parallel initialization by inputting a respective initialization vector to each array.

20. The IC of claim 19 wherein the MBIST circuitry is configured to use a vector of either all 1s or all 0s as the initialization vector for each array.

21. The IC of claim 19 wherein the MBIST circuitry is configured to use a vector of all 1s as the initialization vector for at least one array and is configured to use a vector of all 0s as the initialization vector for at least one other array.

22. An integrated circuit (IC) comprising:
a functional unit including multiple arrays of memory elements, wherein the functional unit is configured to selectively implement a power off state;
memory built-in self test (MBIST) circuitry associated with a plurality of arrays of the functional unit; and
the MBIST circuitry configured to conduct serial testing of the plurality of arrays and to conduct parallel initialization of the plurality of arrays in connection with exiting the power off state by providing initialization data to the plurality of arrays in parallel to set the memory elements to an initialization state and wherein the MBIST circuitry is configured to conduct the parallel initialization in connection with exiting the power off state.

23. The IC of claim 22 wherein the MBIST circuitry is configured to conduct the parallel initialization by inputting a respective initialization vector to each array.

24. The IC of claim 23 wherein the MBIST circuitry is configured to use a vector of either all 1s or all 0s as the initialization vector for each array such that the MBIST circuitry uses a vector of all is as the initialization vector for at least one array and uses a vector of all 0s as the initialization vector for at least one other array.

* * * * *